United States Patent [19]

Jordy et al.

[11] Patent Number: 4,689,772
[45] Date of Patent: Aug. 25, 1987

[54] READ COMPLETE TEST TECHNIQUE FOR MEMORY ARRAYS

[75] Inventors: George J. Jordy, Wappingers Falls; Donald B. Mooney, Poughkeepsie; Joseph M. Mosley, Hopewell Junction, all of N.Y.

[73] Assignee: International Business Machines Corporation, Armonk, N.Y.

[21] Appl. No.: 792,949

[22] Filed: Oct. 30, 1985

[51] Int. Cl.[4] ............................................. G11C 11/40
[52] U.S. Cl. .................................... 365/201; 371/21; 371/51
[58] Field of Search ............... 365/201, 189, 230, 228; 371/21, 51

[56] References Cited

U.S. PATENT DOCUMENTS

| | | | |
|---|---|---|---|
| 3,795,901 | 3/1974 | Boehm et al. | 340/172.5 |
| 3,982,111 | 9/1976 | Lerner et al. | 235/153 |
| 4,004,222 | 1/1977 | Gebhard | 324/158 |
| 4,380,805 | 4/1983 | Proebsting | 365/201 |

OTHER PUBLICATIONS

"Functional and Level Fail Detection for Register Array Testing" by P. P. Heavey and V. E. Simpson, IBM Technical Disclosure Bulletin, vol. 15, No. 4, Sep. 1972, pp. 1135-1136.

*Primary Examiner*—Terrell W. Fears
*Attorney, Agent, or Firm*—John D. Crane

[57] ABSTRACT

A circuit and method for generating a read complete signal for a high speed densely packaged monolithic memory is disclosed. The memory is designed to utilize an externally generated address valid signal which indicates that the address to the memory is valid. The receipt of the address valid signal sets a set/reset latch and starts the memory. The addressed memory cells are sensed. When at least one memory cell has data at its output below a threshold, the data are said to be unstable and the set/reset latch is then conditioned to be reset. When the data sensed by all the sensing circuits are stable, a signal is sent to the set/reset latch to cause it to be reset. The resetting of the set/reset latch causes an output thereof to change state. This state change comprises the read complete signal which is used to determine the read cycle time of the memory and may also be used in diagnostic tests of the memory.

11 Claims, 6 Drawing Figures

IDELIZED CHIP SIGNALS

READ COMPLETE TEST TECHNIQUE FOR MEMORY ARRAYS

FIELD OF THE INVENTION

The invention relates to random access memories and more particularly with a circuit and method for using same to determine the timing requirements thereof. The practice of the invention has particular utility for memory chip final test as well as system level diagnostics.

CROSS REFERENCE TO RELATED APPLICATIONS

U.S. patent application Ser. No. 624,488 entitled "Improved Random Access Memory Array Employing Complementary Transistor Switch (CTS) Memory Cells" filed June 25, 1984 by Y. H. Chan, F. D. Jones and W. F. Stinson.

U.S. patent application Ser. No. 682,391 entitled "Improved Random Access Memory", filed Dec. 17, 1984 by G. J. Jordy and J. M. Mosley.

U.S. patent application Ser. No. 624,486 entitled "Voltage Mode Operation Scheme For Bipolar Arrays" filed June 25, 1984 by Y. H. Chan and J. R. Struk.

U.S. patent application Ser. No. 682,388 entitled "Improved Random Access Memory" filed Dec. 17, 1984 by G. J. Jordy and J. M. Mosley.

U.S. patent application Ser. No. 624,489 entitled "Improved Random Access Memory Employing Complementary Transistor Switch (CTS) Memory Cells", filed June 25, 1984 by Y. H. Chan.

BACKGROUND OF THE INVENTION

High-speed densely packaged semiconductor random access memories of the type which can be utilized with the circuit and method of the present invention are very difficult to test. A typical random access memory which might utilize the present invention may have a read/write cycle time of about 3 nanoseconds. State of the art memory testers typically have an accuracy of 0.5 nanoseconds. Consequently, using a state of the art memory tester device for determining whether manufactured memory circuits are operating within specification may give rise to significant measurement error which may result in a many good circuits being rejected and/or many bad circuits being accepted.

Once a circuit is accepted as operating within specifications, using that circuit in a complete random access memory of a digital computer may result in system operation problems such as a failure to be able to read or write data in a specified time even though each circuit in the memory has met its individual specifications. A complete array of chips is also subject to aging and environmental effects which may result in a memory malfunction.

BACKGROUND ART

The following patents and publication are directed to memory array circuitry and more particularly to memory array diagnostic and test circuitry. It is to be appreciated that the following art is not submitted to be the only, the best, or the most pertinent art.

Patents

U.S. Pat. No. 3,795,901 entitled "Data Processing Memory System With Bidirectional Data Bus" granted Mar. 5, 1974 to R. F. Boehm et al and assigned to IBM Corp.

U.S. Pat. No. 3,982,111 entitled "Memory Diagnostic Arrangement" granted Sept. 21, 1976 to E. M. Lerner et al and assigned to Bell Telephone Laboratories, Inc.

U.S. Pat. No. 4,004,222 entitled "Test System For Semiconductor Memory Cell" granted Jan. 18, 1977 to R. E. Gebhard and assigned to SEMI.

U.S. Pat. No. 4,380,805 entitled "Tape Burn-In Circuit" granted Apr. 19, 1983 and assigned to Mostek Corp.

Publication

"Functional and Level Fail Detection For Register Array Testing" by P. P. Heavey et al, IBM Technical Disclosure Bulletin, Vol. 15, No. 14, September 1972, pages 1135–36.

SUMMARY OF THE INVENTION

The invention is directed to a circuit and method for accurately determining the access time of a high speed densely packaged semiconductor memory array. A "read complete" signal is provided by employing an "address valid" signal. A "read complete" signal is defined as an on chip generated signal which indicates that a read operation has been completed. An "address valid" signal is defined as a signal generated by the system coupled to the chip that indicates when the address (and data if a write operation is in process) has become valid and the chip operation can start. The "address valid" signal is known to the prior art and has been employed to eliminate logical noise on address input lines. The "address valid" signal is used to indicate the start of a chip operation. The operation to be performed may be either a read or a write and the particular type of operation is defined by another control line. For purposes of the present invention, the control line can be assumed to indicate a read operation and hence is not shown. The "address valid" signal is the last switching input to the chip and is used to gate all the operations within the chip. With this synchronization signal, the internal workings of the chip are completely determined and all node voltages and branch currents can be found.

Using the fact that the state of the chip and all input signals are known at the time of the address valid signal; the sequence of events that lead to the resolution of data at the output of the chip can be analyzed.

With the working knowledge of how the data stored in the memory array are resolved in each sense amplifier circuit; a circuit is provided to manifest when the sense amplifier has resolved the contents of the selected address. This resolution is indicated by a "read complete" signal for each addressed memory cell. When all the "read complete" signals have been developed, the read complete signal (RC) is developed. The elapsed time interval between the "address valid" signal and the "read complete" signal is the "access time" of the memory array.

The primary object of the invention to provide an improved random access memory.

A further primary object of the invention is to provide a random access memory which includes circuitry for aiding and facilitating the testing of the memory array by a test machine.

A further primary object of the invention is to provide a random access memory which includes circuitry for aiding and facilitating system diagnostic testing of the random access array.

A still further object of the invention is to provide a random access memory which includes circuitry for greatly simplifying the accurate measurement of the "access time" of the memory.

The foregoing and other objects, features and advantages of the invention will be apparent from the following more particular description of preferred embodiments of the invention, as illustrated in the accompanying drawings which form a part of the original disclosure.

DESCRIPTION OF THE PREFERRED EMBODIMENT

This invention deals with random access memories and specifically with the timing requirements of them.

Consider for a moment a static RAM. There usually are many timing specifications to describe its proper usage. One such timing specification is the access time which is specified as the time from the last switched address input until the data out passes thru a threshold level. This specification takes into account the circuit, process, power supply, and temperature variables that affect the access time. Thus, the chip must always be used in a system with an access time specification which is longer than the great majority of actual product in order to assure that the memory read or write operation is complete. The "Read Complete" signal according to the present invention is produced at a time when the outputs of the chip reflect the contents of the addressed memory location.

The read complete signal is made possible through the use of the address valid signal. The address valid signal is known to the prior art and has been successfully used to eliminate logical noise on address input lines, so it will only be briefly recapped here. The address valid signal is used to indicate that the address bits are valid at the input to the memory and to start chip operation. The operation to be performed may be either a read or a write. The address valid signal is the last switching input to the chip prior to a memory read or write and is used to gate all the operations within the chip. Once this synchronization signal has been received, the chip responds thereto in a completely determined manner and all node voltages and branch currents can be found.

Using the idea that the state of the chip and all input signals are known at the time of the address valid signal; the sequence of events that lead to the resolution of data at the output of the chip can be analyzed. With the working knowledge of how the data stored in the memory array are resolved in the sense amplifier circuit; a circuit can be designed to tell when the sense amplifier has resolved the contents of the selected address. Thus a "Read Complete" signal can be produced.

Figure 1:
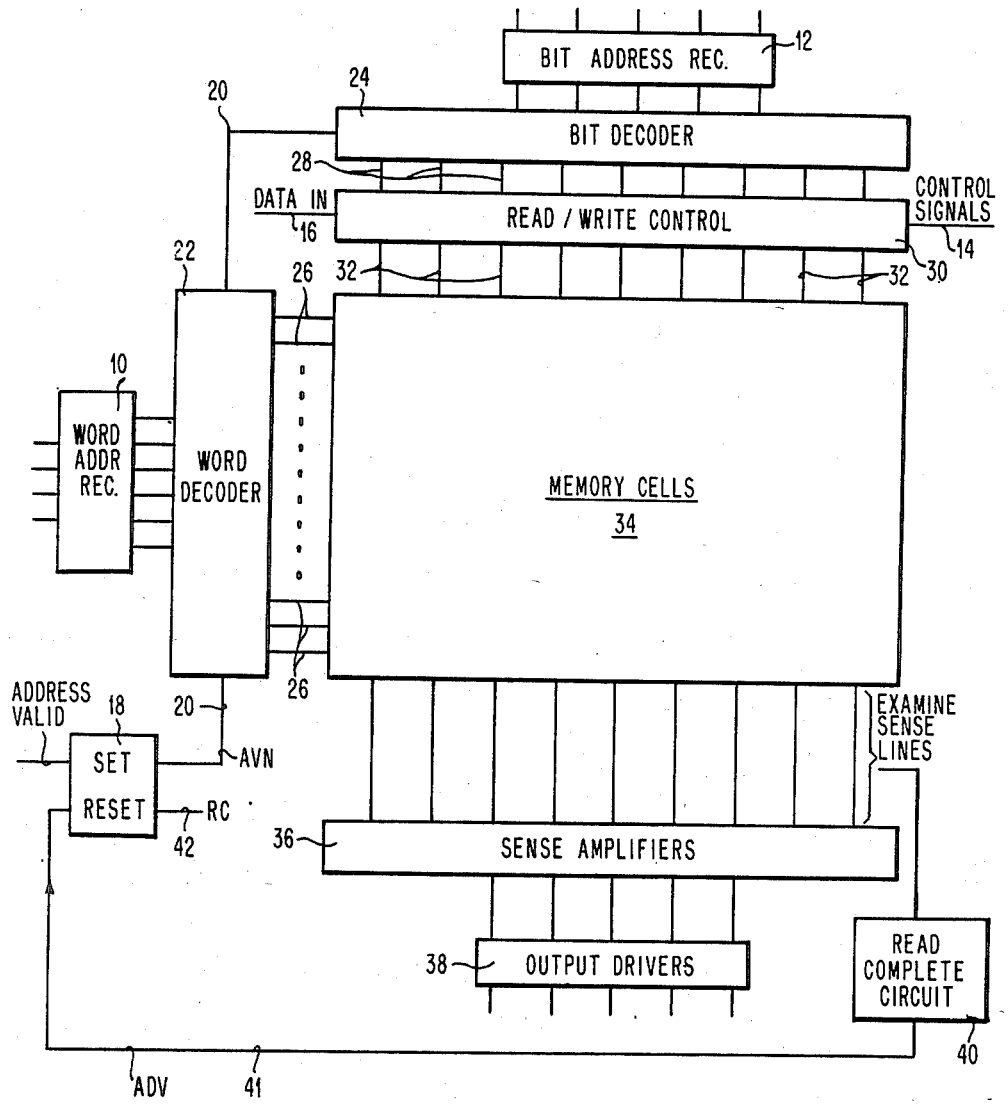
FIG. 1 is a block diagram of a memory array in accordance with the invention.

FIG. 1 is a block diagram of a typical memory array which utilizes the present invention and illustrates the functional elements in the preferred embodiment of the present invention that produces the read complete signal. The memory system illustrated in FIG. 1 includes a word address receiver 10 and a bit address receiver 12 which receive address data from an attached computer system or the like which is either requesting or writing data to the memory. The memory system also receives control signals over the control lines 14 which are used to define whether an addressed memory location is to be read or written to. For purposes of the present invention, the control lines 14 specify a read operation. Data to be stored in the memory is received over the Data In line 16. An address valid signal is developed by the system coupled to the circuits of FIG. 1 in a conventional manner and is used to tell the circuits of FIG. 1 that the address data output from the word address receiver 10 and the bit address receiver 12 is valid and can be used to access the addressed location.

The address valid signal sets the address valid latch 18. This starts the operation of the memory. Once the address valid latch is set, a signal is sent over the line 20 which starts the word decoder 22 and the bit decoder 24 which comprise conventional address decoders. In one embodiment of the present invention, the word decoder 22 is operative to decode the word address into one of 128 word lines 26 and the bit decoder is operative to decode the bit address into one of sixteen groups where each group includes 9 pairs of bit select lines 28. The bit select lines 28 then go to a read/write control circuit 30 which controls the signals on the pairs of memory sense lines 32 which select the specific desired memory cells 34 physically located along the word line selected by the word decoder 22. A plurality of sense amplifiers 36 are provided to sense the data from each of the selected memory bit locations in a read operation. As there are only 9 selected cells at a time in the illustrated configuration, only 9 sense amplifiers 36 are required. The data from the sense amplifiers 36 are transmitted to the output drivers 38 which couple to the computer wired to the memory of the present invention.

The word decoder 22, bit decoder 24, read/write control 30, memory cells 34 and sense amplifiers 36 are described in above mentioned patent application Ser. No. 682,391 filed Dec. 17, 1984 and patent application Ser. No. 682,388 filed on Dec. 17, 1984. Both of these patent applications are herein incorporated by reference.

The circuitry of FIG. 1 also includes a plurality of read complete circuits 40 each coupled to a pair of memory sense lines 32. The read complete circuits 40 operate in a manner described below in greater detail to produce a signal indicating that the selected memory cells coupled thereto have been read under control of a computer coupled to the circuitry of FIG. 1. When all the read complete circuits 40 have determined that the cell coupled thereto has been read, a read complete signal is generated on the line 41 which is used to reset the latch 18. The signal on the line 41 or the latched signal indicating read complete on line 42 can be used to indicate that the selected memory operation is now complete as is described in greater detail below.

The "Read Complete" signal is of aid at chip final test and as a diagnostic tool. At chip final test the "Read Complete" signal reduces the need for many high speed, high accuracy test circuits. At present, each tester driver circuit must be precisely calibrated to reduce the skew that the chip sees at its inputs. The tester receiver circuits must also be tuned so that they can properly measure the access time. For a typical array product there may be 10 address inputs, 10 data inputs, 10 outputs and some write control and chip control inputs. In all there may be from 25 to 35 signal lines that must have precise timing control. The "Read Complete" signal can reduce that number to 2, the address valid input and the "Read Complete" output.

Besides the use at chip final test the "Read Complete" signal may be used at the system level for diagnostics. The signal can easily indicate if the data from the output are actually valid at the time it is needed by the CPU. If there is a slow path that wasn't known, the "Read Complete" signal can assist in timing analysis. If full use of the "Read Complete" signal is made it could act as a gate for the system clock and thereby improve the overall system performance.

Figure 2:
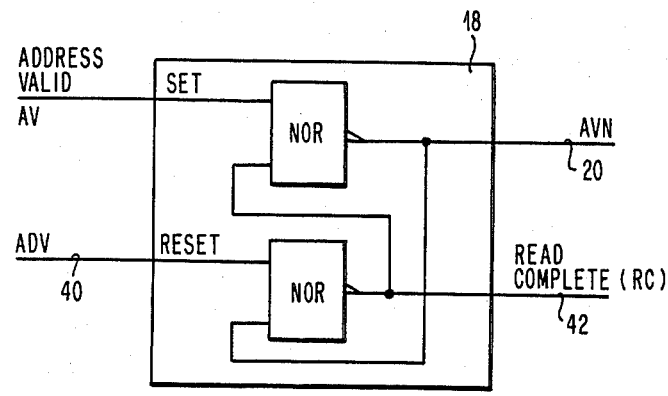
FIG. 2 is a circuit diagram of the set/reset latch of FIG. 1 and includes reference lines found in the block diagram of FIG. 1.

The following figures will illustrate an embodiment of the read complete principal. FIG. 2 illustrates one embodiment of a set/reset latch of the type indicated by lead line 18 in FIG. 1. The set/reset latch is set by the receipt of the address valid signal and interfaces the read complete signal with the outside system when the latch is reset. The address valid signal is the positive pulse labelled AV in FIG. 2a and comes from off the chip. It indicates the start of a memory operation. When the address valid (AV) line rises to indicate the start of a read cycle, AVN falls to begin the selection of the addressed memory cells. This condition indicates that the set/reset latch 18 has been set. The fall of the AVN line comprises a start signal to start the memory cycle. With AVN low and ADV high (line 41), the read complete (RC) signal remains low until the ADV line goes low at which time RC goes high. At this time, the set/reset latch 18 is conditioned to be reset.

Figure 2A:
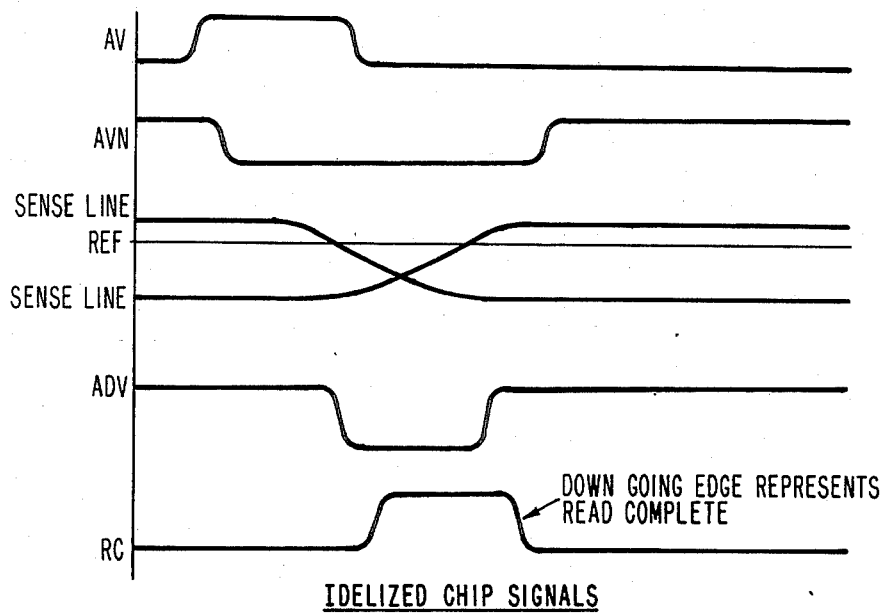
FIG. 2a illustrates the idealized waveforms of chip signals of the memory array in accordance with the invention.

It is important to note that once RC goes high it will remain high until the data has been read, even if AV subsequently falls. When the data from the addressed location has been resolved, ADV will go high again. The read complete signal (RC) will return to a down level to signal the data out levels are valid and deselect the memory array with AVN. This condition indicates that the set/reset latch 18 has been reset. FIG. 2a shows a computer simulation of various signals in the circuitry of FIGS. 1 through 3 which produce the read complete signal which goes negative some time after the address valid signal went high. FIG. 4 is a plot developed by computer simulation of the circuitry of the present invention as typified by that of FIG. 3 and that of the patent applications incorporated herein by reference which shows the read complete signal going low at about 8.4 nanoseconds after the address valid signal started to go high.

Figure 3:
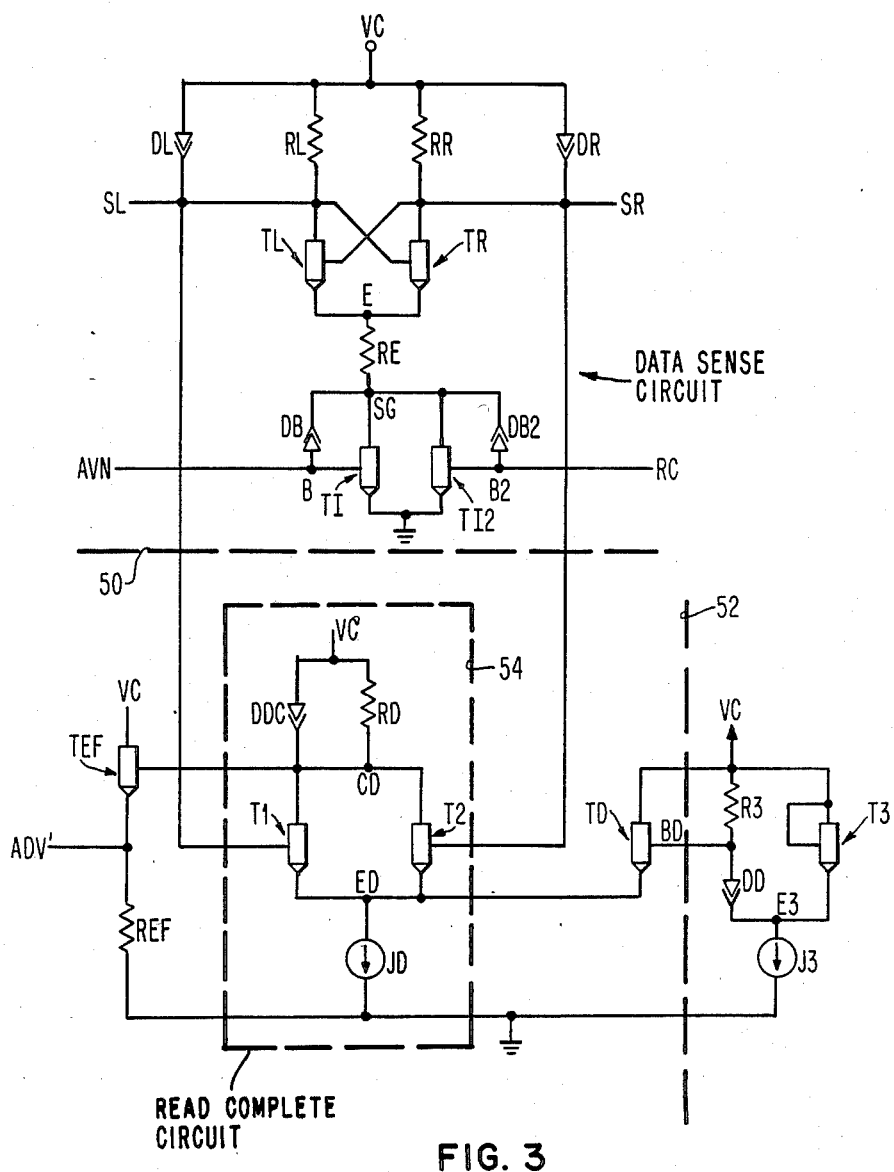
FIG. 3 discloses circuitry employed to produce the "read complete" signal of the memory array in accordance with the invention.
Figure 4:
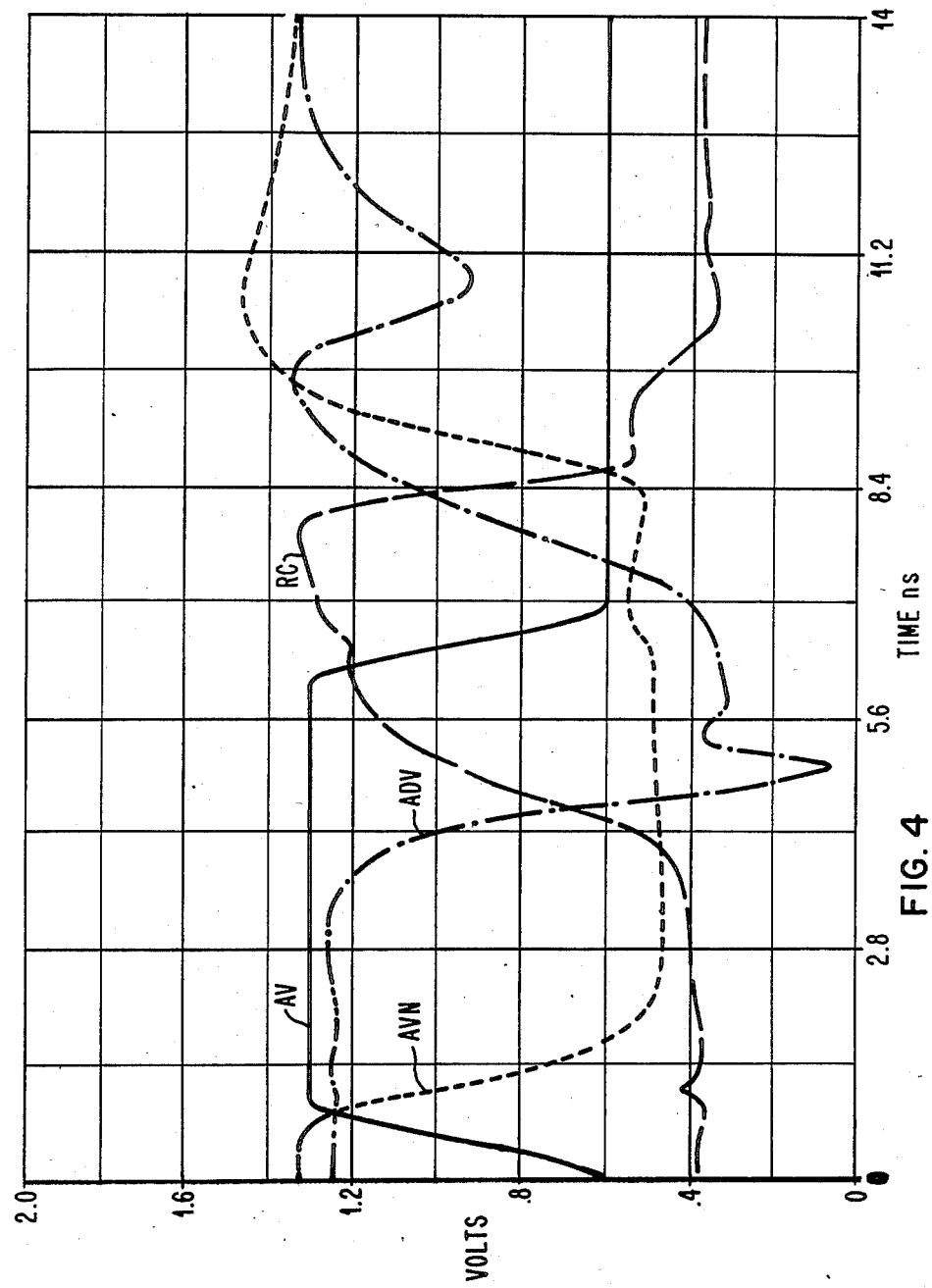
FIG. 4 discloses idealized waveforms referred to hereinafter in the detailed explanation of the invention and the operation thereof.
Figure 5:
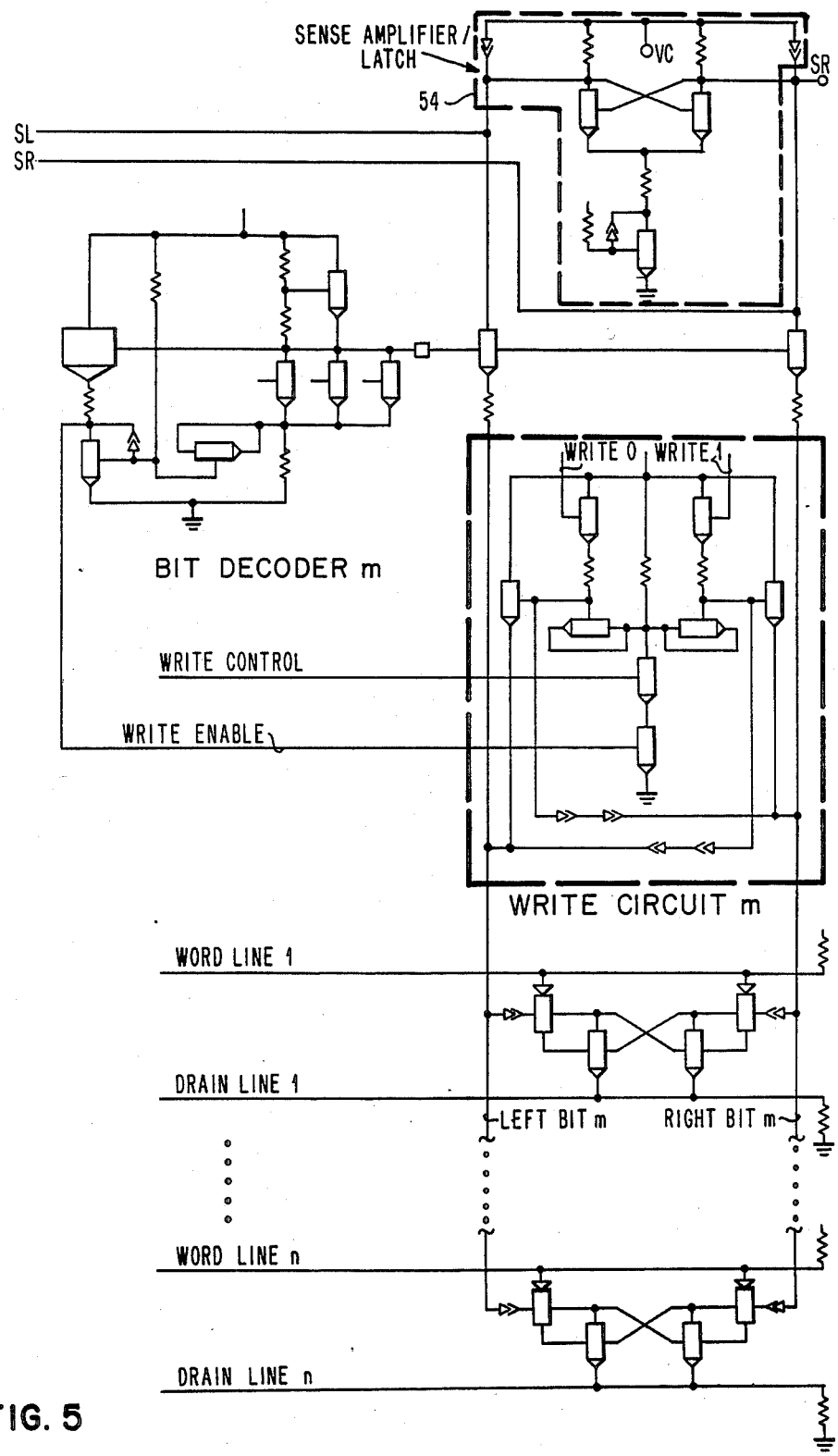
FIG. 5 illustrates the address decode and memory cells of a memory system in which the read complete technique of the present invention has application.

FIG. 3 shows the circuitry including that used to produce the read complete signal. This circuitry includes a sense amplifier latch circuit disposed above dotted line 50, a read complete signal generating circuit below dotted line 50 and a reference circuit disposed to the right of dotted line 52. The sense amplifier latch circuit is used to latch the data read from a memory location and is connected to the bit sense lines through the bit decode circuit. It replaces the sense amplifier latch inside the dotted line 54 as illustrated in FIG. 5 and described in greater detail in the incorporated patent application Ser. No. 682,388 filed Dec. 17, 1984. Specifically, the nodes SL and SR of FIG. 3 are coupled to the nodes SL and SR respectively of FIG. 5 and the sense amplifier latch inside dotted line 54 of FIG. 5 is replaced. The levels at the nodes SL and SR are determined by the data stored in the selected memory cell coupled thereto. TL and TR form a latch which will hold the data read when either T1 or Tl2 is on.

T1, T2, TEF and TD form the read complete signal generating circuit which will determine when the data in the addressed location has successfully been read. The network attached to the base of TD forms a reference voltage at the node BD for a current switch operation between TD and transistors T1 and T2. The circuitry inside dotted line 54 comprises a circuit coupled to the nodes SL and SR which is operative to produce a low level at node CD whenever the signal levels at either of the nodes SL or SR are stable and above the reference voltage at node ED.

It should be noted that FIG. 3 illustrates the circuit configuration through conventional component symbols. The exact component values have not been specified because they depend on the particular voltages, currents, transistors, and diodes which the designer chooses to use to implement the present invention. The circuit elements JD and J3 are ideal current sources although a resistor could be utilized in the circuit as well.

The reference voltage at node BD is about 80% of the positive supply VC. When the voltage at either node SL or SR is above the base voltage of TD, the datum from the addressed cell is stable. Thus the memory cell has been successfully read. When either T1 or T2 conducts, the voltage at node CD goes down. The transistor TEF is part of an emitter follower circuit coupled to the node CD so that as the voltage at node CD falls so does the voltage at node ADV'. The falling signal produced at node ADV' is the "read complete" signal for the coupled memory bit location which was addressed by the word decoder and the bit decoder. In the present embodiment, there are 9 such circuits of the type shown in FIG. 3 which are active during each read operation and the signals appearing at the node ADV' of each such circuit are NORed together to form the signal which appears on line 41 of FIG. 1. When a down level occurs at node ADV' of each of the circuits of the type illustrated in FIG. 3 which are activated in response to the particular memory address location being read, the set/reset latch 18 of FIG. 1 is reset due to a low voltage on the line 41 so that the voltage on line 20 (AVN) will go high and the voltage on line 42 (RC) will go low to indicate that the read operation is complete. This is accomplished by coupling each signal ADV' from the nine circuit configurations of the type illustrated in FIG. 3 to a NAND gate so as to produce at its output the signal ADV illustrated in FIG. 2a. The latch 18 is conditioned to being reset by the falling edge of the signal ADV and is reset by the rising edge of the signal ADV.

While this invention has been particularly described with reference to the preferred embodiments thereof, it will be understood by those skilled in the art that the foregoing and other changes in form and detail may be made to the disclosed embodiments without departing from the spirit and scope of the invention as defined in the following claims.

What is claimed is:

1. In a high speed densely packaged memory including a plurality of memory cells, a circuit for generating, in response to a memory address thereto having been indicated as being valid, a read complete signal generating circuit to indicate that the memory has completed its read operation comprising, in combination:
   means to sense an externally generated memory address valid signal and to produce a start signal to actuate the memory;
   means to sense when the data being read from each memory bit location addressed by said memory address has become stable; and
   means to produce a read complete signal whenever each memory cell being read by each said sense means has become stable, the time between the address valid signal and the read complete signal being the read time for the memory.

2. The read complete signal generating circuit of claim 1 wherein said means to sense the memory address valid signal comprises a set/reset latch which is set by the receipt of the address valid signal.

3. The read complete signal generating circuit of claim 2 wherein said means to produce a read complete signal includes means to reset said set/reset latch, a signal indicating the resetting of said set/reset latch comprising said read complete signal.

4. The read complete signal generating circuit of claim 1 wherein said means to sense includes a circuit to sense when the output of each addressed memory cell is above a reference level.

5. In a high speed densely packaged memory, a circuit for generating, in response to a memory address thereto having been indicated as being valid, a read complete signal generating circuit to indicate that the memory has completed its read operation comprising, in combination:
   a plurality of memory cells arranged in an array;
   means to sense said memory address valid indication and produce in response thereto a start signal;
   memory cell addressing means to address a selected number of said memory cells in response to said memory address and said start signal;
   a plurality of sense circuits coupled to said plurality of memory cells each for sensing the datum stored in one said selected memory cell, each said sense circuit producing an output signal, said output signal being at one level when the sensed datum from the memory cell coupled thereto is stable and at another level when the datum from the memory cell coupled thereto is not stable; and
   means responsive to all said output signals indicating that the data being read from every addressed cell coupled thereto is stable to produce a read complete signal.

6. The read complete signal generating circuit of claim 5 wherein said means to sense said memory address valid signal comprises a set/reset latch which is set by the receipt of the address valid signal.

7. The read complete signal generating circuit of claim 6 wherein said means to produce a read complete signal includes means to reset said set/reset latch, a signal indicating the resetting of said set/reset latch comprising said read complete signal.

8. In a high speed densely packaged memory including a plurality of memory cells, a circuit for generating a read complete signal to indicate that a read operation is complete comprising, in combination:
   means to address a selected number of said memory cells, each selected memory cell producing signals on a pair of sense lines coupled thereto, said sense line signals being representative of the datum stored in each selected memory cell;
   a selected number of pairs of sensing transistors each coupled via the base thereof to one said selected memory cell;
   a selected number of reference signal establishing means each coupled to the emitter of each transistor in one said pair of sensing transistors to establish at each said pair of sensing transistors a reference level; and
   a selected number of output circuit means each coupled to one said pair of sensing transistors at the collector thereof to produce an output signal at one level if both said sense line signals are at a level below said reference level and to produce an output signal at a second level if either said sense line signal is at a level above said reference level, the transition of said output signal from said one level to said second level comprising the read complete signal for the memory cell being sensed by said pair of sensing transistors coupled thereto.

9. The read complete signal generating circuit of claim 8 including a set/reset latch, said set/reset latch being set when said memory cells are addressed, said set/reset latch being conditioned to be reset by one said output signal being at said one level and said set/reset latch being reset when all said output signals are at said second level.

10. In a high speed densely packaged memory, a method for generating a read complete signal to indicate that a memory read has been completed comprising the steps of:
    sensing an externally generated memory address valid signal and producing in response thereto a start memory read signal;
    sensing the data being read from the memory to determine when the data read is stable; and
    producing a read complete signal when the data read has been sensed as being stable.

11. The method of claim 10 additionally including the steps of:
    setting a latch when said start memory read signal is produced;
    conditioning said latch to be reset when at least some data are sensed as being unstable; and
    resetting said latch when all the sensed data are stable, the resetting of said latch comprising the step of producing said read complete signal.

* * * * *